United States Patent
Sano et al.

(10) Patent No.: US 7,724,099 B2
(45) Date of Patent: May 25, 2010

(54) HIGH FREQUENCY OSCILLATOR CIRCUIT WITH FEEDBACK CIRCUIT OF FET AND SHORT-STUB TRANSMISSION LINE

(75) Inventors: Eiichi Sano, Sapporo (JP); Masato Koutani, Osaka (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 34 days.

(21) Appl. No.: 12/076,697

(22) Filed: Mar. 21, 2008

(65) Prior Publication Data

US 2008/0238566 A1  Oct. 2, 2008

(30) Foreign Application Priority Data

Mar. 26, 2007  (JP)  ............................. P2007-078672

(51) Int. Cl.
*H01L 23/66* (2006.01)
(52) U.S. Cl. .............................. 331/107 SL; 331/36 C; 331/96; 331/117 D; 331/117 FE; 331/167; 331/177 V
(58) Field of Classification Search ............... 331/36 C, 331/96, 117 D, 117 FE, 177 V, 167, 107 SL, 331/117 V
See application file for complete search history.

(56) References Cited

U.S. PATENT DOCUMENTS 5,502,420 A * 3/1996 Barclay ...................... 332/135
5,564,100 A * 10/1996 Huang et al. ................. 455/319
5,606,738 A * 2/1997 Onodera et al. .............. 455/333
6,359,521 B1* 3/2002 Nakano et al. ........... 331/117 R
6,611,179 B2* 8/2003 Mashimo ................. 331/177 V
6,636,119 B2* 10/2003 Vathulya ..................... 330/311
6,664,862 B2* 12/2003 Yoshisato et al. ........ 331/108 R
6,836,190 B2* 12/2004 Kato ........................... 331/158
2005/0122177 A1* 6/2005 Ikarashi .................... 331/36 L
2008/0150644 A1* 6/2008 Hosoya et al. ........... 331/117 R

FOREIGN PATENT DOCUMENTS

| JP | 7-221545 | 8/1995 |
| JP | 8-107309 | 4/1996 |
| JP | 10-209752 | 8/1998 |

* cited by examiner

Primary Examiner—Arnold Kinkead
Assistant Examiner—Richard Tan
(74) Attorney, Agent, or Firm—Nixon & Vanderhye P.C.

(57) ABSTRACT

In a high frequency oscillator circuit including first and second field effect transistors, the first field effect transistor has a gate connected to a short-stub transmission line and a drain connected to an oscillation output terminal, and the second field effect transistor has a drain connected to a source of the first field effect transistor and a grounded source. The high frequency oscillator circuit oscillates by using a feedback circuit including the short-stub transmission line and the second field effect transistor. A feedback capacitor is further provided which is connected between a gate of the second field effect transistor and the drain of the first field effect transistor.

22 Claims, 9 Drawing Sheets

HIGH FREQUENCY OSCILLATOR CIRCUIT WITH FEEDBACK CIRCUIT OF FET AND SHORT-STUB TRANSMISSION LINE

BACKGROUND OF THE INVENTION

1. Field of the Invention

The present invention relates to a high frequency oscillator circuit, a phase-locked loop circuit (referred to as a PLL circuit hereinafter) using the high frequency oscillator circuit, a semiconductor device using the PLL circuit, and a communication apparatus including the semiconductor device. In particular, the present invention relates to a high frequency oscillator circuit for generating a high frequency signal such as a microwave signal, a quasi-millimeter wave signal or a millimeter wave signal, utilizing two field effect transistors with a feedback circuit of a short-stub transmission line and one field effect transistor, and further relates to a PLL circuit using the high frequency oscillator circuit, a semiconductor device using the PLL circuit, and a communication apparatus using the semiconductor device.

2. Description of the Related Art

Figure 12:
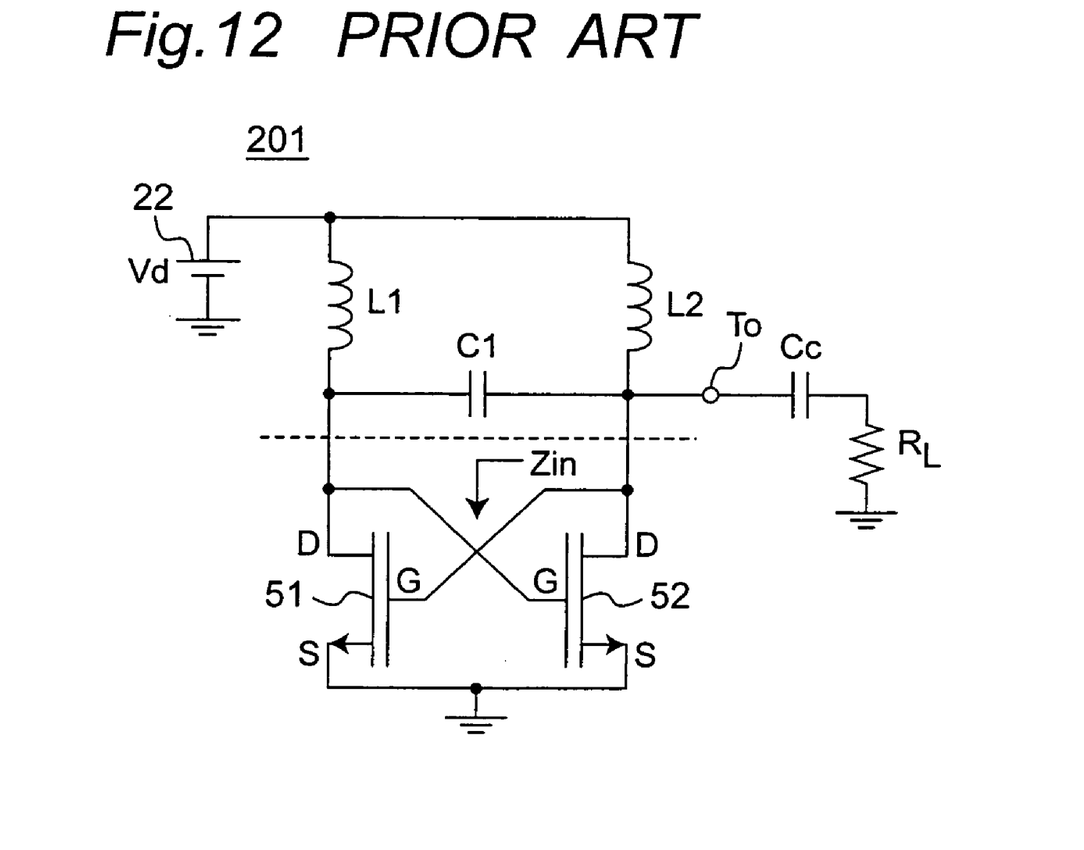
FIG. 12 is a circuit diagram of the high frequency oscillator circuit 201 according to the first prior art.

FIG. 12 is a circuit diagram of a high frequency oscillator circuit 201 according to a first prior art. The high frequency oscillator circuit 201 is an oscillator circuit using a cross-coupled type multivibrator and, as shown in FIG. 12, is configured to include two field effect transistors 51 and 52, a capacitor C1, inductors L1 and L2, and a direct-current voltage source 22, and then, achieves an oscillating operation by developing a negative resistance.

Figure 13:
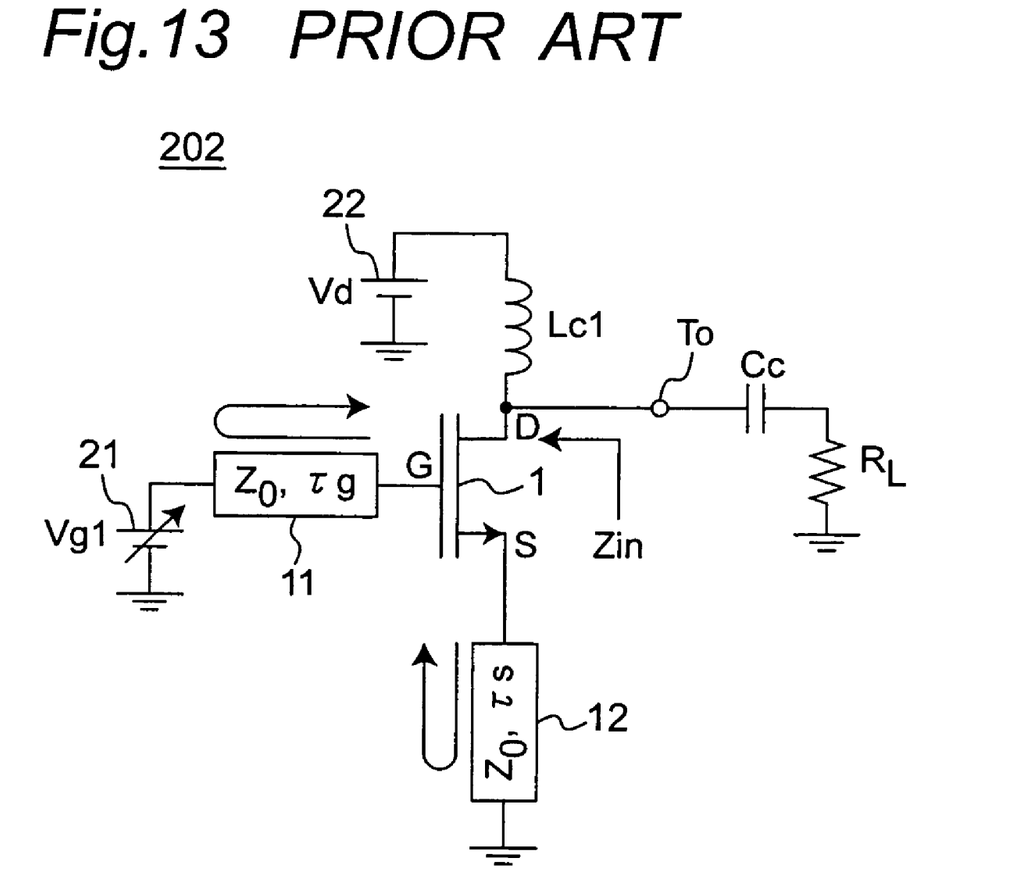
FIG. 13 is a circuit diagram of the high frequency oscillator circuit 202 according to the second prior art.

FIG. 13 is a circuit diagram of a high frequency oscillator circuit 202 according to a second prior art. The high frequency oscillator circuit 202 is a gate and source feedback type oscillator circuit, and as shown in FIG. 13, it is configured to include a field effect transistor 1, two transmission lines 11 and 12 (which are generally microstrip lines or coplanar lines on a semiconductor substrate or a dielectric substrate) constituting short-stub feedback circuits, respectively, a high frequency blocking inductor Lc1, and two direct-current voltage sources 21 and 22, and then, achieves an oscillating operation by developing a negative resistance. The high frequency oscillator circuit 202 performs the oscillating operation in the case where an input impedance Zin of the field effect transistor 1 when seen from an output terminal To connected to a drain of the field effect transistor 1 satisfies the following expressions (1) and (2):

$$\text{Re}(Zin)+R_L<0 \quad (1), \text{ and}$$

$$\text{Im}(Zin)=0 \quad (2),$$

where Re(•) denotes a real number part of an argument and Im(•) denotes an imaginary part of the argument, and these will apply hereinafter. In addition, $R_L$ denotes a load resistance value.

Figure 14:
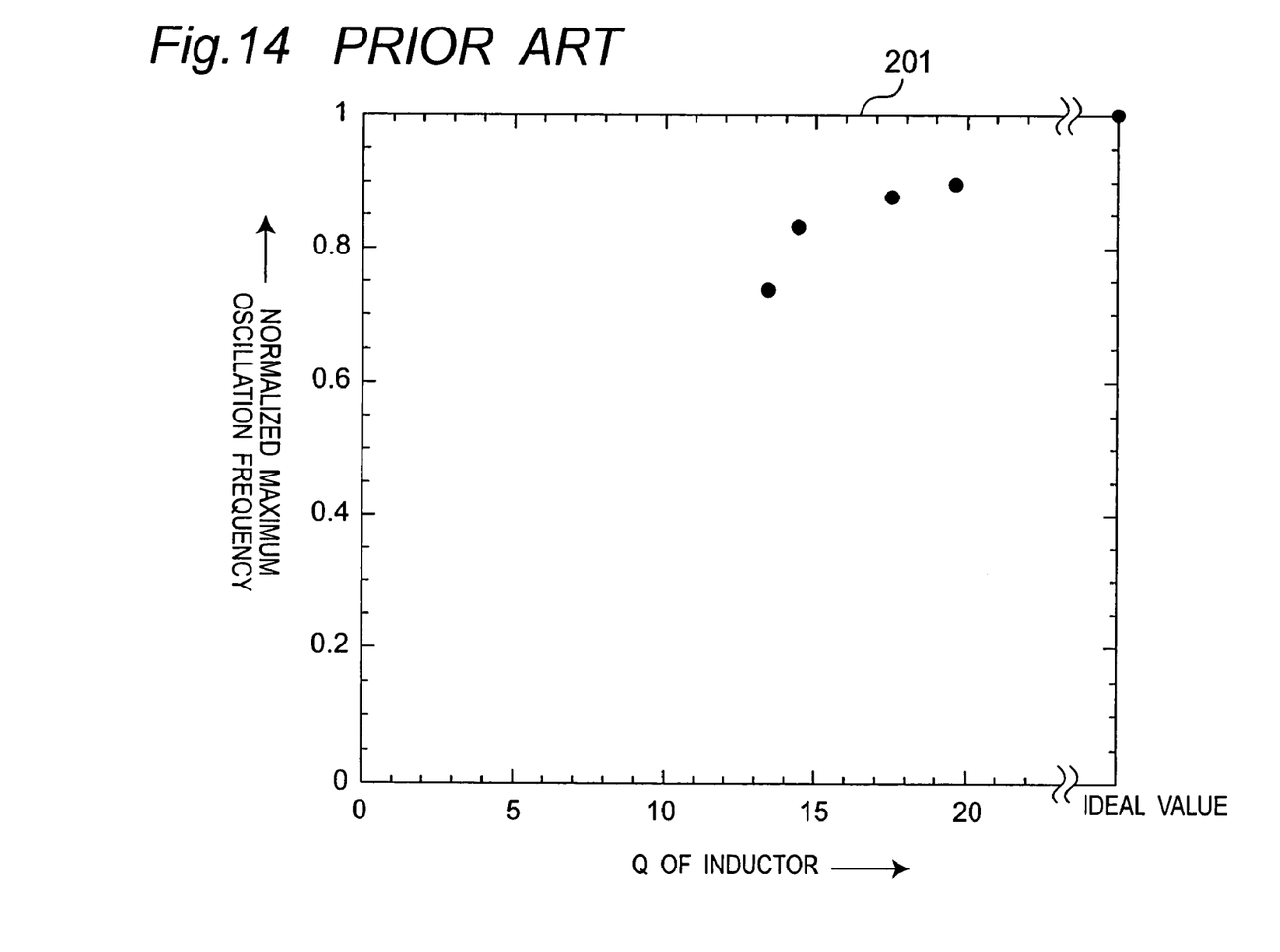
FIG. 14 is a graph showing simulation results of the high frequency oscillator circuit 201 shown in FIG. 12 and showing a normalized oscillation frequency relative to a Q-value of the inductor.

FIG. 14 is a graph showing simulation results of the high frequency oscillator circuit 201 shown in FIG. 12 and showing a normalized oscillation frequency relative to a Q-value of the inductor. A reference oscillation frequency for normalization is 50 GHz. As apparent from FIG. 14, the high frequency oscillator circuit 201 is disadvantageously required to include the inductor having a relatively high Q-value.

Furthermore, the high frequency oscillator circuit 202 shown in FIG. 13 has the following problems. A line length of each of the transmission lines 11 and 12 connected to the gate and source of the field effect transistor 1, respectively, is relatively large (e.g., about 1.5 millimeters (mm) in a 30-GHz oscillator circuit using microstrip lines having a width of 14 micrometers (μm)). An area of the high frequency oscillator circuit 202 is made large, a loss of each of the short-stub feedback circuits increases, and a Q-value of the circuit decreases.

Moreover, the Japanese patent laid-open publication No. JP-7-221545-A discloses a cascade-coupled type voltage-controlled oscillator capable of pulling out sufficiently high negative resistance characteristic from the circuit and having strong oscillation power. The voltage-controlled oscillator is a cascade-connected voltage-controlled oscillator in which a direct-current flowing from a power source is applied first to a transistor of an oscillation amplifier unit and then to a transistor of a buffer amplifier. Furthermore, a resistance that decides the direct-current of the voltage-controlled oscillator is connected to the transistor of the buffer amplifier outside of a feedback loop of the oscillation amplifier unit. Due to this, the resistance that decides the direct-current of the voltage-controlled oscillator does not act as a loss resistance of the feedback loop of the oscillation amplifier unit. Therefore, sufficiently high negative resistance characteristic can be pulled out from the voltage-controlled oscillator, and this leads to that the cascade-connected voltage-controlled oscillator can output strong oscillation power. The voltage-controlled oscillator is configured so that not the feedback circuit but the transistor of the oscillation amplifier unit is connected to a source of the transistor of the oscillation amplifier and in which an oscillation signal is outputted from a drain of the transistor of the oscillation amplifier unit.

The Japanese patent laid-open publication No. JP-8-107309-A discloses a voltage-controlled oscillator circuit capable of dealing with low frequency noise output from a power source circuit of the voltage-controlled oscillator circuit without any connection of a ripple filter or the like to an outside circuit of the voltage-controlled oscillator circuit. The voltage-controlled oscillator circuit is characterized in that a capacitor that grounds a base of an amplification transistor of a buffer amplifier circuit unit in a low frequency alternating current manner, the buffer amplifier circuit is allowed to be regarded as a ripple filter for the low frequency noise added to the buffer amplifier circuit unit from the power source circuit and is allowed to perform ordinary amplification operation for a signal applied from an oscillator circuit unit. The voltage-controlled oscillator circuit is configured so that not a feedback circuit but a transistor of the oscillator circuit unit is connected to a source of the amplification transistor of the buffer amplifier unit.

The Japanese patent laid-open publication No. JP-10-209752-A discloses an oscillator circuit constituted as a microwave integrated circuit so as to be able to obtain optimum oscillation states with selected frequencies even if a resonance frequency of a resonance circuit is selected over a wide frequency range. In the oscillator circuit constituted as a microwave integrated circuit, an external terminal is arranged at a gate of an oscillation field effect transistor, and a resonance circuit is connected to the external terminal. Further, a series-connected circuit in which a first feedback capacitance and a first switch field effect transistor are connected in series and a series-connected circuit in which a second feedback capacitance and a second switch field effect transistor are connected in series are arranged in parallel between a source of the oscillation field effect transistor and a ground. By turning on or off the two switch field effect transistors at a gate-controlled voltage, it is possible to change a feedback capacitance value to, for example, three types of values and to obtain oscillation states optimum for three types of resonance frequencies. The oscillator circuit constituted as a microwave integrated circuit is configured so that a frequency selection switch field effect transistor is connected to the source of the oscillation field effect transistor.

Each of the oscillator circuits disclosed in the Japanese patent laid-open publications Nos. JP-7-221545-A, JP-8-107309-A, and JP-10-209752-A has the following problems. It is difficult to make an area of the oscillator circuit smaller, and it is difficult for the oscillator circuit to oscillate with a higher oscillation frequency.

SUMMARY OF THE INVENTION

It is an object of the present invention to provide a high frequency oscillator circuit, a PLL circuit using the high frequency oscillator circuit, a semiconductor device using the PLL circuit, and a communication apparatus using the semiconductor device, which are capable of solving the above-stated problems, without any inductor having a higher Q-value, and are made smaller in size and oscillating with a higher oscillation frequency as compared with the prior arts.

According to a first non-limiting aspect of the present invention, there is provided a high frequency oscillator circuit including first and second field effect transistors. The first field effect transistor has a gate connected to a short-stub transmission line and a drain connected to an oscillation output terminal, and the second field effect transistor has a drain connected to a source of the first field effect transistor and a grounded source. The high frequency oscillator circuit oscillates by using a feedback circuit including the short-stub transmission line and the second field effect transistor.

In addition, the above-mentioned high frequency oscillator circuit preferably further includes a feedback capacitor connected between a gate of the second field effect transistor and the drain of the first field effect transistor.

Further, the above-mentioned high frequency oscillator circuit preferably further includes a variable reactance element connected to a gate of the second field effect transistor, where an oscillation frequency of the high frequency oscillator circuit is changed by adjusting a reactance value of the variable reactance element.

According to a second non-limiting aspect of the present invention, there is provided a PLL circuit including the voltage-controlled oscillator circuit.

According to a third non-limiting aspect of the present invention, there is provided a semiconductor device including the PLL circuit.

According to a fourth non-limiting aspect of the present invention, there is provided a communication apparatus including the semiconductor device.

According to a non-limiting embodiment of the high frequency oscillator circuit, it is not necessary to provide any inductor having a large Q-value, and the high frequency oscillator circuit can be made so as to be smaller in size and to oscillate with a higher oscillation frequency than those of the prior arts. In addition, by constituting the PLL circuit using the high frequency oscillator circuit or the communication apparatus using the PLL circuit, it is advantageously possible to generate a local oscillation signal in a band of, for example, several tens of gigahertz, to realize high-speed transmission of large-capacity information, and to satisfy requirements of downsizing and the like.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 11 is a circuit diagram for explaining an input impedance Zin of an ordinary RLC series-connected oscillator circuit 105 which corresponds to an oscillator circuit unit of each of the high frequency oscillator circuits 101, 102 and 103 according to the first, second, and third preferred embodiments and to which a load resistance RL is connected when seen from an output terminal To;

DETAILED DESCRIPTION OF THE PREFERRED EMBODIMENTS

Preferred embodiments of the present invention will be described hereinafter with reference to the drawings. In the preferred embodiments, the same components are denoted by the same reference symbols.

First Preferred Embodiment

Figure 1:
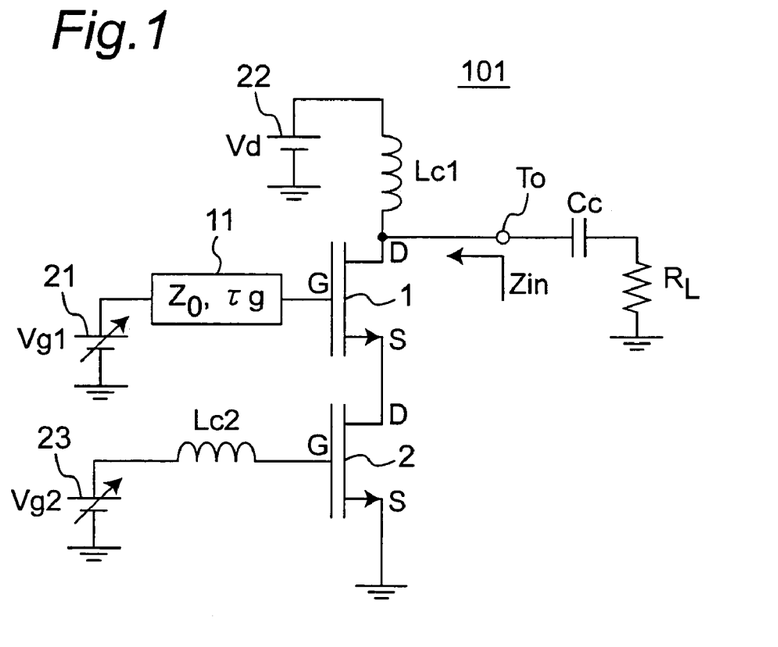
FIG. 1 is a circuit diagram of a high frequency oscillator circuit 101 according to a first preferred embodiment of the present invention.

FIG. 1 is a circuit diagram of a high frequency oscillator circuit 101 according to a first preferred embodiment of the present invention. The high frequency oscillator circuit 101 according to the first preferred embodiment is characterized, as compared with the high frequency oscillator circuit 202 of FIG. 13, in that a field effect transistor 2 operating as a feedback circuit is connected to a source of an oscillation field effect transistor 2 in place of the transmission line 12 of FIG. 13.

Referring to FIG. 1, a gate of the oscillation field effect transistor 1 is grounded via a short-stub transmission line (or short-circuit stub transmission line) 11 having a characteristic impedance Zo and a delay time τg and a variable direct-current voltage source 21 for applying a gate bias voltage Vg1, and further, a drain of the oscillation field effect transistor 1 is grounded via a high frequency blocking inductor Lc1 and a direct-current voltage source 22 for applying a direct-current voltage Vd. A source of the oscillation field effect transistor 1 is connected to a drain of the field effect transistor 2 acting as a feedback circuit and having a grounded source, and a gate of the field effect transistor 2 is grounded via an inductor Lc2 and a variable direct-current voltage source 23 for applying a gate bias voltage Vg2. In addition, an oscillation signal output from the drain of the oscillation field effect transistor 1 is grounded via an output terminal To, a load resistance RL, and a coupling capacitor Cc.

The high frequency oscillator circuit 101 configured as stated above exhibits the following characteristic functions and advantageous effects as will be described later in detail with reference to simulation results shown in FIGS. 5 to 10.

(1) The high frequency oscillator circuit 101 can oscillate with a higher oscillation frequency and can be made smaller in area as compared with the prior arts since it is advantageously possible to reduce a line length by replacing the source-side transmission line 12 by the field effect transistor 2.

(2) A change in the oscillation frequency according to a change in an inductance of the inductor Lc2 can be suppressed quite small, and the deviation in the oscillation frequency can be reduced even if a process irregularity is present. In other words, inductance dependency of the circuit 101 (sensitivity to change in inductance) can be reduced and the margin between the actual value and the design value can be made larger, and this leads to easily designing of the circuit 101.

Second Preferred Embodiment

Figure 2:
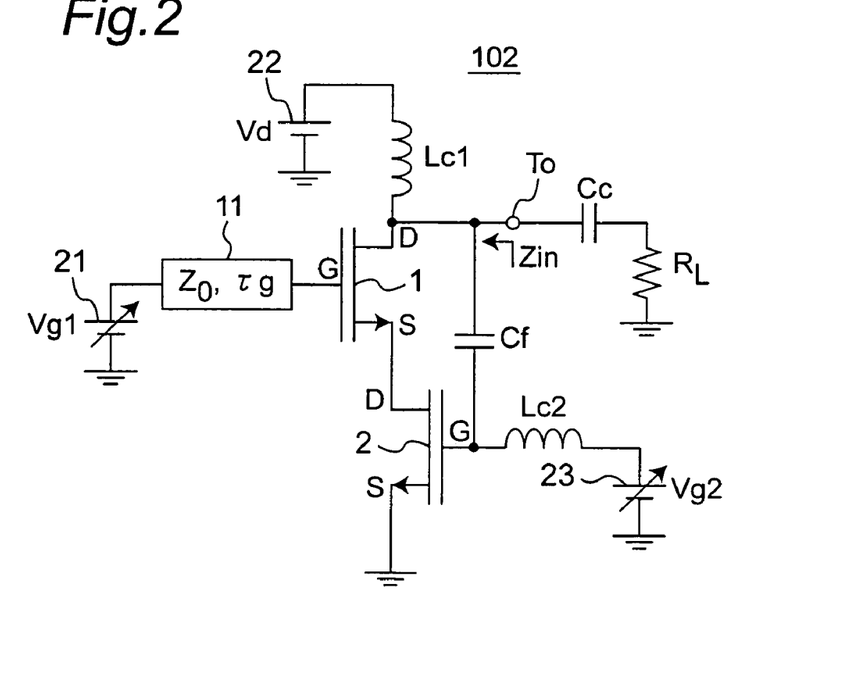
FIG. 2 is a circuit diagram of a high frequency oscillator circuit 102 according to a second preferred embodiment of the present invention.

FIG. 2 is a circuit diagram of a high frequency oscillator circuit 102 according to a second preferred embodiment of the present invention. As shown in FIG. 2, the high frequency oscillator circuit 102 according to the second preferred embodiment is characterized, as compared with the high frequency circuit 101 of FIG. 1, in that a capacitor Cf for feeding back an oscillation output signal to a field effect transistor 2 is inserted between the gate of the field effect transistor 2 and the drain of the field effect transistor 1. In this case, the feedback capacitor Cf and the inductor Lc2 constitute a high-pass filter circuit.

The high frequency oscillator circuit 102 configured as stated above can exhibit the same functions and advantageous effects as those of the high frequency oscillator circuit 101 as will be described later in detail with reference to the simulation results shown in FIGS. 5 to 10. In addition, the high frequency oscillator circuit 102 can perform an oscillating operation with a higher oscillation frequency than that of the high frequency oscillator circuit 101, further reduce the change in the oscillation frequency according to the change in the inductance of the inductor Lc2, i.e. the sensitivity can be further reduced. Besides, even if the process irregularity is present, it is possible to further reduce the deviation in the oscillation frequency.

Third Preferred Embodiment

Figure 3:
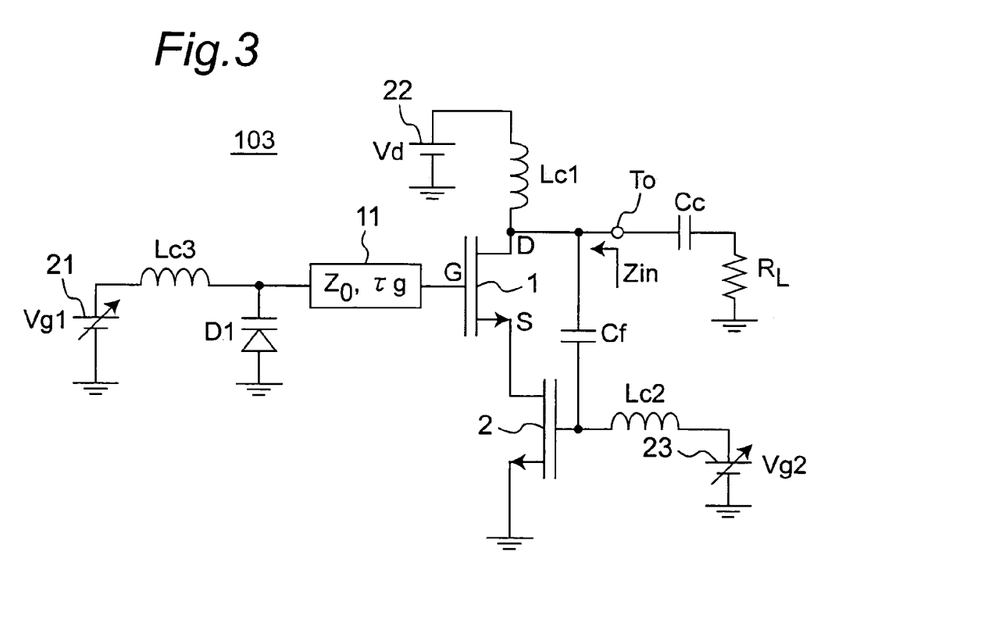
FIG. 3 is a circuit diagram of a high frequency oscillator circuit 103 according to a third preferred embodiment of the present invention.

FIG. 3 is a circuit diagram of a voltage controlled type high frequency oscillator circuit 103 according to a third preferred embodiment of the present invention. As shown in FIG. 3, the voltage controlled type high frequency oscillator circuit 103 according to the third preferred embodiment is characterized, as compared with the high frequency circuit 102 of FIG. 2, in that a varactor diode D1 is inserted between a gate of a field effect transistor 2 and a direct-current voltage source 21. In this case, one end of a transmission line 11 is connected to a gate of a field effect transistor 1, the other end of the transmission line 11 is connected to a cathode of the varactor diode D1, and an anode of the varactor diode D1 is grounded. In addition, the cathode of the varactor diode D1 is connected to the variable direct-current voltage source 21 via a high frequency blocking inductor Lc3. The variable direct-current voltage source 21 applies a direct-current bias voltage Vg1 to the inductor Lc3, the varactor diode D1, and the field effect transistor 1. By changing the direct-current bias voltage Vg1 applied from the variable direct-current voltage source 21, a capacitance value of the varactor diode D1 is changed. It is thereby possible to change an electric length of a feedback circuit connected to the gate of the field effect transistor 1 and to change an oscillation frequency of the high frequency oscillator circuit 103.

The voltage controlled type high frequency oscillator circuit 103 configured as stated above can exhibit the same functions and advantageous effects as those of the high frequency oscillator circuits 101 and 102. In addition, the oscillation frequency of the high frequency oscillator circuit 103 can be easily changed by adjusting or changing the direct-current bias voltage Vg1.

In the present preferred embodiment, the varactor diode D1 is used, however, the present invention is not limited to this. A variable reactance element that can change a reactance value can be used in place of the varactor diode D1. In addition, the high frequency oscillator circuit 103 may dispense with the feedback capacitor Cf.

Fourth Preferred Embodiment

Figure 4:
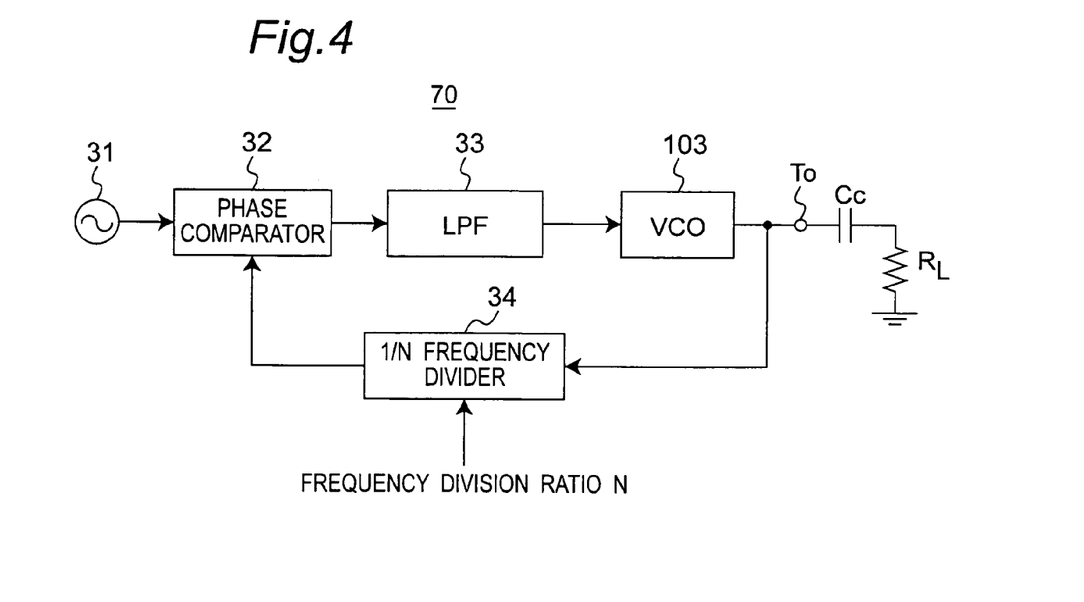
FIG. 4 is a circuit diagram of a PLL circuit 70 including the high frequency oscillator circuit 103 according to a fourth preferred embodiment of the present invention.

FIG. 4 is a circuit diagram of a PLL circuit 70 including the high frequency oscillator circuit 103 according to a fourth preferred embodiment of the present invention.

Referring to FIG. 4, a reference oscillation signal generated by a reference oscillator 31 and having a reference oscillation frequency is inputted to a phase comparator 32 whereas a high frequency oscillation signal from a voltage-controlled oscillator circuit 103 is inputted to the phase comparator 32 via a 1/N frequency divider 34 dividing an input signal by a frequency division ratio N. The phase comparator 32 outputs a signal indicating a result of phase comparison between the input two signals to the voltage-controlled oscillator circuit (VOC) 103 via a low-pass filter (LPF) 33. The VOC circuit 103 outputs a high frequency oscillation signal to a load resistance RL via an output terminal To and a coupling capacitor Cc, and also outputs the same signal to the 1/N frequency divider 34. The direct-current bias voltage Vg2 shown in FIG. 3 corresponds to an output voltage from the LPF 33.

The PLL circuit 70 as configured as stated above can oscillate and output a high frequency oscillation signal synchronously with the reference oscillation signal generated by the reference oscillator 31 having higher oscillation frequency accuracy and having a frequency of N times as high as the reference oscillation frequency as well known.

Figure 15:
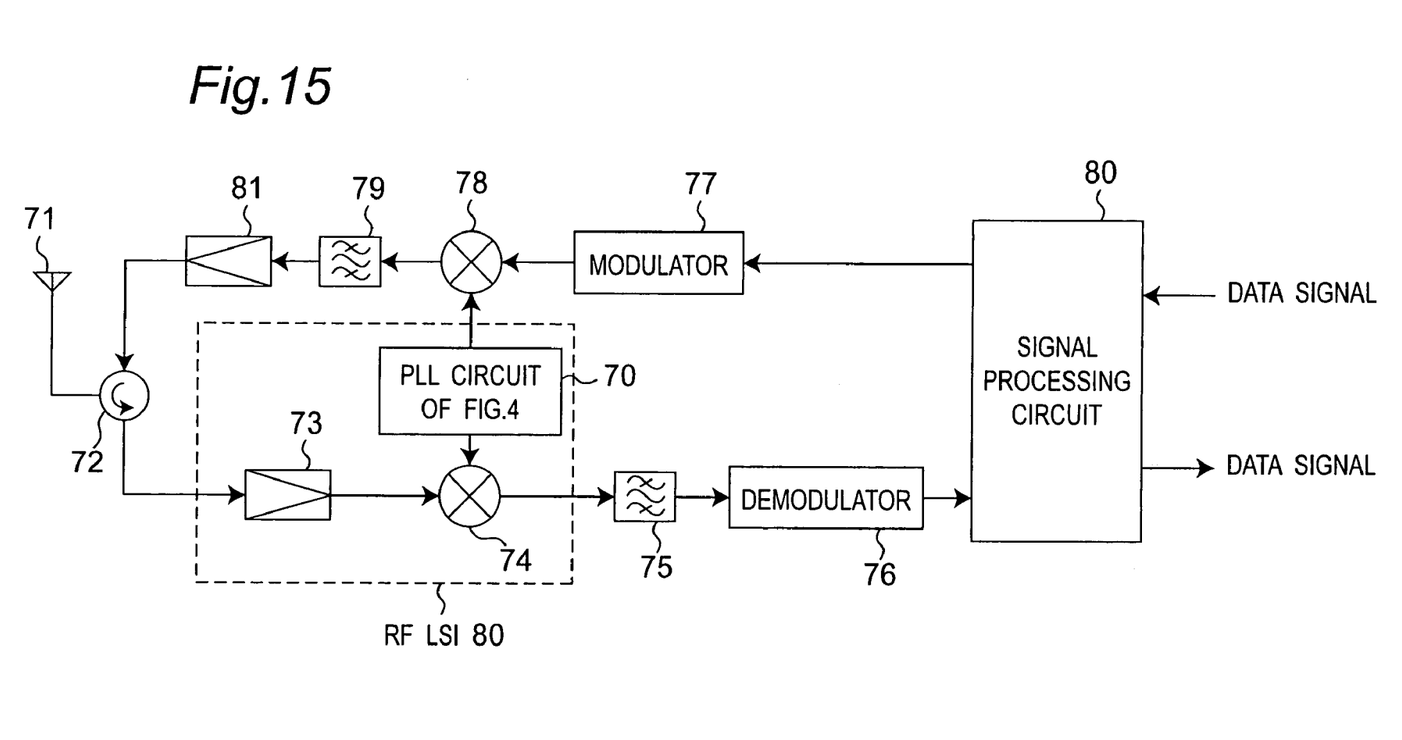
FIG. 15 is a block diagram of a wireless data communication transceiver including the PLL circuit 70 of FIG. 4.

FIG. 15 is a block diagram of a wireless data communication transceiver including the PLL circuit 70 of FIG. 4.

Referring to FIG. 15, the wireless data communication transceiver includes an antenna 71, a circulator 72, a low-noise amplifier 73, a mixer 74, a band-pass filter 75, a demodulator 76, a signal processing circuit 80, a modulator 77, a mixer 78, a band-pass filter 79, a power amplifier 81, and the PLL circuit 70 of FIG. 4, which is used as a local oscillator for generating local oscillation signals for transmission and receiving and outputting the same local oscillation signals to the mixers 74 and 78. The PLL circuit 70, the mixer 74 and the low-noise amplifier 73 can be constituted by a RF LSI (Radio Frequency Large Scaled Integrated circuit) 70 of a semiconductor device.

Referring to FIG. 15, the signal processing circuit 80 receives a data signal, performs a predetermined transmission signal processing on the received data signal, and output a resulting baseband signal including the data signal to a modulator 77, which modulates a carrier signal according to the inputted baseband signal and outputs a modulated signal to a mixer 78. The mixer 78 mixes the modulated signal with the local oscillation signal from the PLL circuit 70 to generate a mixed signal to the power amplifier 81 through the band-pass filter 79 for passing therethrough a wireless transmission signal, which is outputted to the antenna 71 through the circulator 72 to radiate the wireless transmission signal from the antenna 71.

On the other hand, a wireless received signal is received by the antenna 71, and is inputted to the mixer 74 through the circulator 72 and the low-noise amplifier 73. The mixer 74 mixes the wireless received signal with the local oscillation signal from the PLL circuit 70, and outputs a mixed signal through a band-pass filter 75 to the demodulator 76, which demodulates a filtered mixed signal to generate and output a demodulated baseband signal to the signal processing circuit 80. The signal processing circuit 80 receives the same baseband signal, performs a predetermined receiving signal processing on the baseband signal, and output a resulting data signal.

Implemental Examples

The simulations of CMOS integrated circuits including the high frequency oscillator circuits 101, 102, 201 and 202 according to the first preferred embodiment, the second preferred embodiment, the first prior art, and the second prior art, respectively and formed by 0.18 µm process, and simulation results will next be described.

Figure 5:
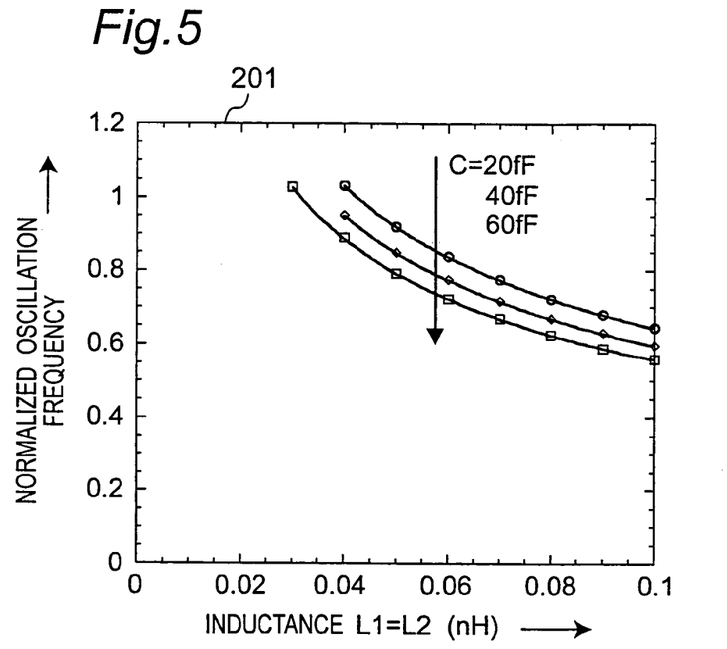
FIG. 5 is a graph showing simulation results of a high frequency oscillator circuit 201 shown in FIG. 12 according to a first prior art and showing a normalized oscillation frequency relative to an inductance of inductors L1 and L2 (L1=L2)
Figure 6:
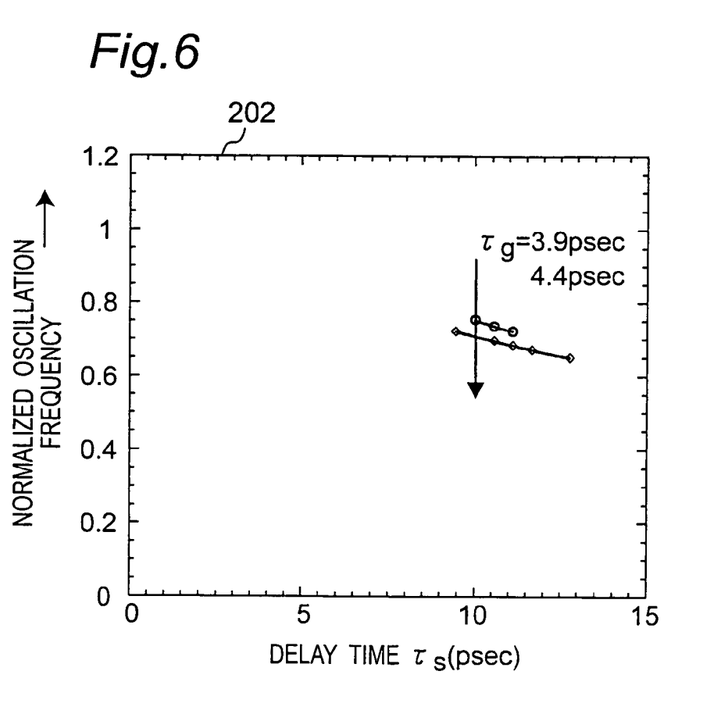
FIG. 6 is a graph showing simulation results of a high frequency oscillator circuit 202 shown in FIG. 13 according to a second prior art and showing a normalized oscillation frequency relative to delay time $\tau s$ of a source-side transmission line 12.
Figure 7:
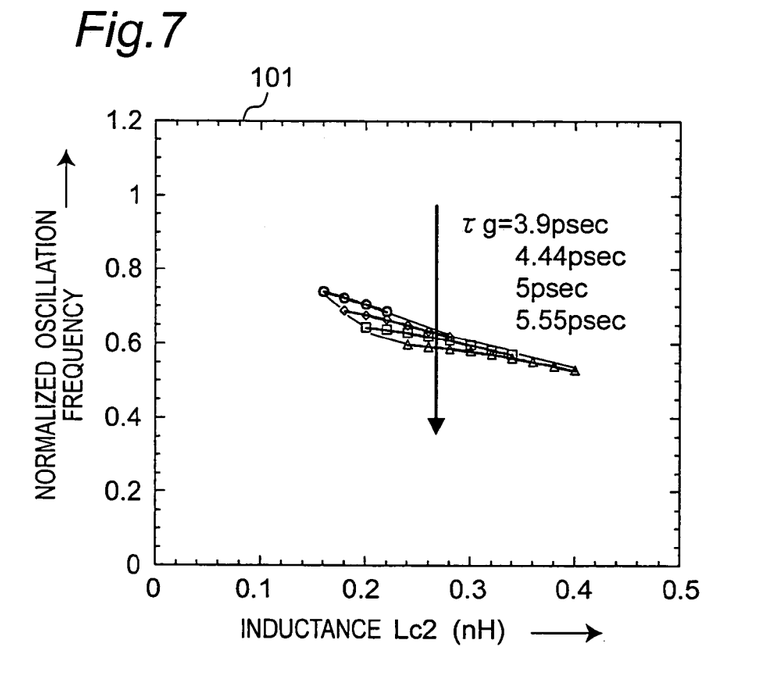
FIG. 7 is a graph showing simulation results of the high frequency oscillator circuit 101 shown in FIG. 1 and showing a normalized frequency relative to an inductance of an inductor Lc2.
Figure 8:
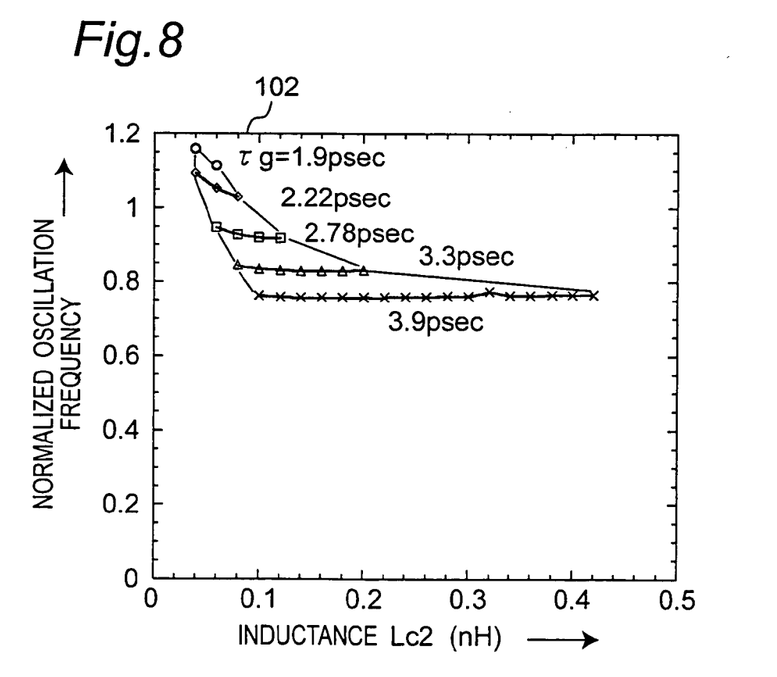
FIG. 8 is a graph showing simulation results of the high frequency oscillator circuit 102 shown in FIG. 2 and showing a normalized frequency relative to an inductance of an inductor Lc2.

FIG. 5 is a graph showing simulation results of the high frequency oscillation circuit 201 shown in FIG. 12 according to the first prior art and showing a normalized oscillation frequency relative to the inductance of the inductors L1 and L2 (L1=L2). FIG. 6 is a graph showing simulation results of the high frequency oscillation circuit 202 shown in FIG. 13 according to the second prior art and showing a normalized oscillation frequency relative to the delay time τs of the source-side transmission line 12. FIG. 7 is a graph showing simulation results of the high frequency oscillation circuit 101 shown in FIG. 1 according to the first preferred embodiment and showing a normalized oscillation frequency relative to the inductance of the inductor Lc2. FIG. 8 is a graph showing simulation results of the high frequency oscillation circuit 102 shown in FIG. 2 according to the second preferred embodiment and showing a normalized oscillation frequency relative to the inductance of the inductor Lc2. In the simulations of FIGS. 5 to 8, the reference oscillation frequency for normalization is 50 GHz.

The oscillation frequency of the high frequency oscillator circuit 101 shown in FIG. 7 is almost equal to that of the high frequency oscillator circuit 202 shown in FIG. 6. However, the oscillation frequency of the high frequency oscillator circuit 102 shown in FIG. 8 is about 1.2 times as high as that of the high frequency oscillator circuit 201 shown in FIG. 5 and about 1.5 times as high as that of the high frequency oscillator circuit 202 shown in FIG. 6. Therefore, it is seen that the high frequency oscillator circuits 101 and 102 according to the first and second preferred embodiments, respectively, can oscillate with a higher frequency. Moreover, the high frequency oscillator circuit 102 shown in FIG. 8 can make the change in the oscillation frequency small according to the change in the inductance of the inductor Lc2. Even if the process irregularity is present, the irregularity in the oscillation frequency can be reduced. In other words, the inductance dependency can be reduced and the margin between the actual value and the design value can be made larger, and this leads to easily designing of the same circuit.

Figure 11:
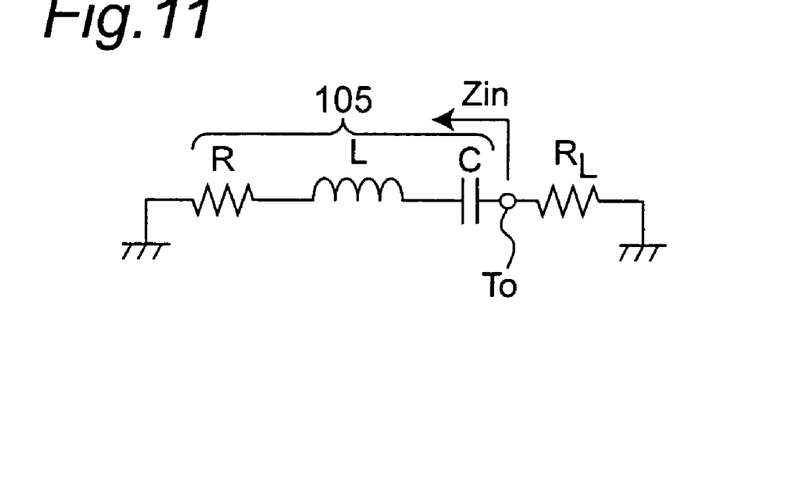

FIG. 11 is a circuit diagram for explaining an input impedance Zin of an ordinary RLC series-connected oscillator circuit 105 which corresponds to an oscillator circuit unit of each of the high frequency oscillator circuits 101, 102 and 103 according to the first, second and third preferred embodiments and to which a load resistance RL is connected when seen from an output terminal To of the ordinary RLC series-connected oscillator circuit 105. The oscillation conditions for this ordinary oscillation circuit 105 are similar to those represented by the above expressions (1) and (2), and an oscillation frequency of the ordinary oscillation circuit 105 corresponds to the frequency when the value of a left-hand side of the expression (2) changes from negative to positive.

Figure 9:
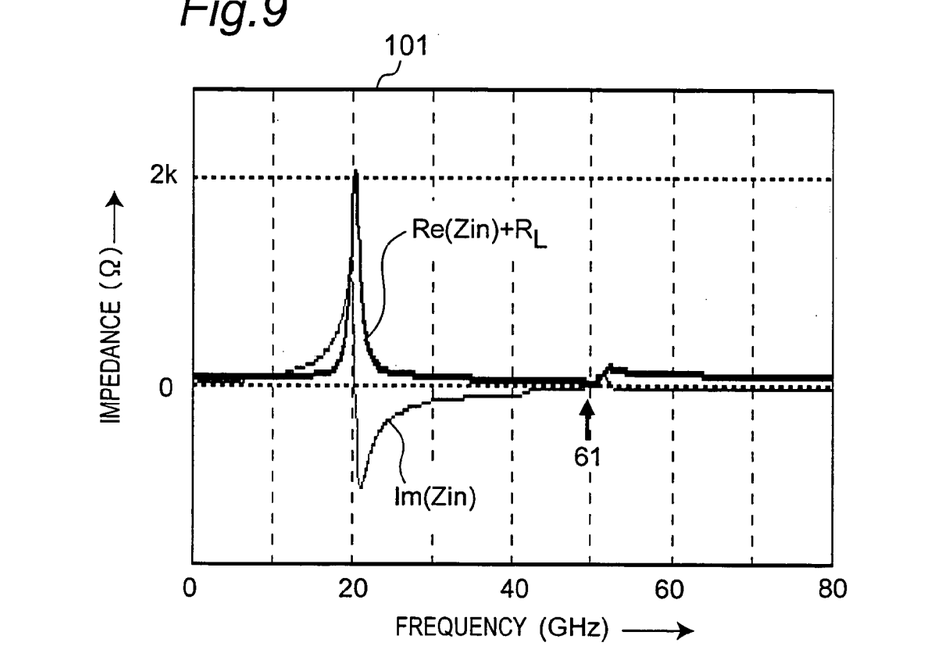
FIG. 9 is a graph showing simulation results of the high frequency circuit 101 and showing a frequency characteristic of an impedance.
Figure 10:
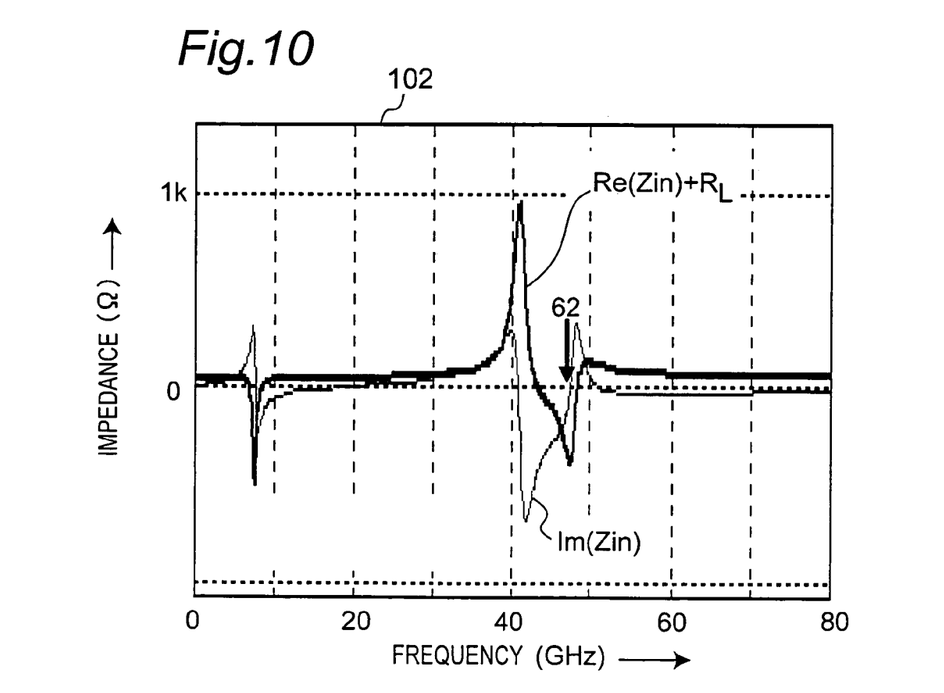
FIG. 10 is a graph showing simulation results of the high frequency circuit 102 and showing a frequency characteristic of an impedance.

FIG. 9 is a graph showing simulation results of the high frequency circuit 101 and showing a frequency characteristic of the impedance. FIG. 10 is a graph showing simulation results of the high frequency circuit 102 and showing a frequency characteristic of the impedance. At a point 61 of FIG. 9, an imaginary part Im(Zin)=0 but a real number part Re(Zin)+RL>0. Due to this, the above-stated oscillation conditions are not satisfied. That is, if there is no feedback capacitance in the high frequency oscillator circuit 101 shown in FIG. 9, it is necessary to increase a line length of the gate-side transmission line 11 so as to satisfy the oscillation conditions. This disadvantageously makes the oscillation frequency lower. In order to solve this problem, the feedback capacitor Cf is inserted in the high frequency oscillator circuit 102 shown in FIG. 2. Then this leads to that the negative resistance can be intensified and the oscillation frequency can be made higher as obvious from FIG. 10.

As stated so far, each of the high frequency oscillator circuits 101, 102 and 103 according to the respective preferred embodiments of the present invention can satisfy the oscillation conditions even if the line length of the gate-side transmission line is smaller than that of the gate-side transmission line satisfying the oscillation conditions in the gate and source feedback oscillator circuit. That is, it is possible to satisfy the oscillation conditions even with a higher frequency. Furthermore, by making the gate-side transmission line 11 shorter and replacing the source-side transmission line 12 by the field effect transistor 2, it is possible to make the circuit area smaller.

In the high frequency oscillator circuit 102 shown in FIG. 2, the inductance of the inductor Lc2 of the high-pass filter circuit constituted by the feedback capacitor Cf and the inductor Lc2 is equal to or smaller than 0.1 nH, and the increase in area is small. In addition, since the change in the oscillation frequency according to the inductance and the capacitance of the high frequency oscillator circuit 102 is small and the oscillation frequency is decided by the line length of the gate-side transmission line 11, the high frequency oscillator circuit 102 is excellent in design and reproducibility. Besides, by adopting a microstrip line having a grounded bottom-layer wiring as the transmission line 11, it is possible to remove the influence of, for example, conductive silicon semiconductor substrate.

Each of the high frequency oscillator circuits 101, 102 and 103 and the PLL circuit using the high frequency oscillator circuit 103 configured as stated so far according to the respective preferred embodiments can be formed in a semiconductor device such as a CMOS semiconductor integrated circuit, and the PLL circuit can generate a local oscillation signal in a band of, for example, several tens of gigahertz. A wireless communication apparatus using the PLL circuit can realize high-speed transmission of large-capacity information and can satisfy requirements such as downsizing. The examples of the wireless communication apparatus include a portable telephone, and examples of the semiconductor device used in the wireless communication apparatus include applications such as UWB (Ultra Wide Band) applications and a transceiver LSI for high-speed communication in a 60 GHz band.

As stated so far in detail, the high frequency oscillator circuit according to the present invention can advantageously dispense with an inductor having a higher Q-value, and can advantageously be made small in size and oscillate with an oscillation frequency higher than that of the prior arts. In addition, by constituting the PLL circuit using the high frequency oscillator circuit or the communication apparatus using the PLL circuit, it is advantageously possible to generate a local oscillation signal in a band of, for example, several tens of gigahertz, to realize high speed transmission of large-capacity information, and to satisfy such requirements as downsizing.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A high frequency oscillator circuit, comprising:
    a first field effect transistor having a gate connected to a short-stub transmission line and a drain connected to an oscillation output terminal;
    a second field effect transistor having a drain connected to a source of the first field effect transistor and a grounded source; and
    a feedback capacitor connected directly between a gate of the second field effect transistor and the drain of the first field effect transistor,
    wherein the high frequency oscillator circuit oscillates by using a feedback circuit including the short-stub transmission line, the second field effect transistor, and the feedback capacitor.

2. The high frequency oscillator circuit as claimed in claim 1, further comprising a variable reactance element connected to the gate of the first field effect transistor, an oscillation frequency of the high frequency oscillator circuit being changed by adjusting a reactance value of the variable reactance element.

3. The high frequency oscillator circuit as claimed in claim 2, wherein the gate of the second field effect transistor is connected to an inductor in series with a variable dc voltage source.

4. The high frequency oscillator circuit as claimed in claim 1, wherein the gate of the second field effect transistor is connected to an inductor in series with a variable dc voltage source.

5. The high frequency oscillator circuit as claimed in claim 1, wherein a source of the second field effect transistor is directly connected to the ground source.

6. The high frequency oscillator circuit as claimed in claim 1, wherein the gate of the first field effect transistor is connected via the short-stub transmission line with a variable dc voltage source.

7. The high frequency oscillator circuit as claimed in claim 6, further comprising a variable reactance element connected to the gate of the first field effect transistor, an oscillation frequency of the high frequency oscillator circuit being changed by adjusting a reactance value of the variable reactance element.

8. The high frequency oscillator circuit as claimed in claim 7,
    wherein the variable dc voltage source connected to the gate of the first transistor is a first variable dc voltage source, and
    wherein the gate of the second field effect transistor is also connected to an inductor in series with a second variable dc voltage source such that the inductor and the feedback capacitor form a high-pass filter.

9. The high frequency oscillator circuit as claimed in claim 6,
    wherein the variable dc voltage source connected to the gate of the first transistor is a first variable dc voltage source, and
    wherein the gate of the second field effect transistor is also connected to an inductor in series with a second variable dc voltage source such that the inductor and the feedback capacitor form a high-pass filter.

10. The high frequency oscillator circuit as claimed in claim 9, wherein voltages applied to the gates of the first and second field effect transistors are independent of each other.

11. A phase-locked loop circuit comprising a voltage-controlled oscillator circuit, the voltage-controlled oscillator circuit being a high frequency oscillator circuit, the high frequency oscillator circuit comprising:
    a first field effect transistor having a gate connected to a short-stub transmission line and a drain connected to an oscillation output terminal;
    a second field effect transistor having a drain connected to a source of the first field effect transistor and a grounded source;
    a feedback capacitor connected directly between a gate of the second field effect transistor and the drain of the first field effect transistor; and
    a variable reactance element connected to a gate of the second field effect transistor, an oscillation frequency of the high frequency oscillator circuit being changed by adjusting a reactance value of the variable reactance element, wherein the high frequency oscillator circuit oscillates by using a feedback circuit including the short-stub transmission line, the second field effect transistor, and the feedback capacitor.

12. The phase-locked loop circuit as claimed in claim 11, wherein the gate of the second field effect transistor is connected to an inductor in series with a variable dc voltage source.

13. The phase-locked loop circuit as claimed in claim 11, wherein the gate of the first field effect transistor is connected via the short-stub transmission line with a variable dc voltage source.

14. The phase-locked loop circuit as claimed in claim 13,
wherein the variable dc voltage source connected to the gate of the first transistor is a first variable dc voltage source, and
wherein the gate of the second field effect transistor is also connected to an inductor in series with a second variable dc voltage source such that the inductor and the feedback capacitor form a high-pass filter.

15. A semiconductor device comprising a phase-locked loop circuit, the phase-locked loop circuit comprising a high frequency voltage-controlled oscillator circuit, the high frequency voltage-controlled oscillator circuit comprising:
a first field effect transistor having a gate connected to a short-stub transmission line and a drain connected to an oscillation output terminal;
a second field effect transistor having a drain connected to a source of the first field effect transistor and a grounded source;
a feedback capacitor connected directly between a gate of the second field effect transistor and the drain of the first field effect transistor; and
a variable reactance element connected to a gate of the second field effect transistor, an oscillation frequency of the high frequency voltage-controlled oscillator circuit being changed by adjusting a reactance value of the variable reactance element,
wherein the high frequency voltage-controlled oscillator circuit oscillates by using a feedback circuit including the short-stub transmission line, the second field effect transistor and the feedback capacitor.

16. The semiconductor device as claimed in claim 15, wherein the gate of the second field effect transistor is connected to an inductor in series with a variable dc voltage source.

17. The semiconductor device as claimed in claim 15, wherein the gate of the first field effect transistor is connected via the short-stub transmission line with a variable dc voltage source.

18. The semiconductor device as claimed in claim 17,
wherein the variable dc voltage source connected to the gate of the first transistor is a first variable dc voltage source, and
wherein the gate of the second field effect transistor is also connected to an inductor in series with a second variable dc voltage source such that the inductor and the feedback capacitor form a high-pass filter.

19. A communication apparatus comprising a semiconductor device, the semiconductor device comprising a phase-locked loop circuit, the phase-locked loop circuit comprising a high frequency voltage-controlled oscillator circuit, the high frequency voltage-controlled oscillator circuit comprising:
a first field effect transistor having a gate connected to a short-stub transmission line and a drain connected to an oscillation output terminal;
a second field effect transistor having a drain connected to a source of the first field effect transistor and a grounded source;
a feedback capacitor connected directly between a gate of the second field effect transistor and the drain of the first field effect transistor; and
a variable reactance element connected to a gate of the second field effect transistor, an oscillation frequency of the high frequency voltage-controlled oscillator circuit being changed by adjusting a reactance value of the variable reactance element,
wherein the high frequency voltage-controlled oscillator circuit oscillates by using a feedback circuit including the short-stub transmission line, the second field effect transistor, and the feedback capacitor.

20. The communication apparatus as claimed in claim 19, wherein the gate of the first field effect transistor is connected via the short-stub transmission line with a variable dc voltage source.

21. The communication apparatus as claimed in claim 20,
wherein the variable dc voltage source connected to the gate of the first transistor is a first variable dc voltage source, and
wherein the gate of the second field effect transistor is also connected to an inductor in series with a second variable dc voltage source such that the inductor and the feedback capacitor form a high-pass filter.

22. The communication apparatus as claimed in claim 19, wherein the gate of the second field effect transistor is connected to an inductor in series with a variable dc voltage source.

* * * * *